(12) United States Patent
Michiyoshi et al.

(10) Patent No.: US 9,035,710 B2
(45) Date of Patent: May 19, 2015

(54) PWM SIGNAL GENERATING CIRCUIT, PRINTER, AND PWM SIGNAL GENERATING METHOD

(71) Applicants: Takashi Michiyoshi, Osaka (JP); Tetsuro Tatebe, Osaka (JP)

(72) Inventors: Takashi Michiyoshi, Osaka (JP); Tetsuro Tatebe, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/141,860

(22) Filed: Dec. 27, 2013

(65) Prior Publication Data
US 2014/0191817 A1    Jul. 10, 2014

(30) Foreign Application Priority Data
Jan. 7, 2013    (JP) .................................. 2013-000293

(51) Int. Cl.
*H03K 7/08*    (2006.01)
*G03G 15/043*    (2006.01)

(52) U.S. Cl.
CPC ................ *H03K 7/08* (2013.01); *G03G 15/043* (2013.01)

(58) Field of Classification Search
USPC ............................. 332/109; 375/238; 341/152
See application file for complete search history.

(56) References Cited

U.S. PATENT DOCUMENTS

| | | | | |
|---|---|---|---|---|
| 4,500,822 | A | * | 2/1985 | Tajima et al. .................. 388/813 |
| 5,148,168 | A | * | 9/1992 | Masuda et al. ................. 341/152 |
| 5,880,644 | A | * | 3/1999 | Schmidt et al. ................ 332/109 |
| 2010/0183168 | A1 | | 7/2010 | Michiyoshi |
| 2010/0277356 | A1 | | 11/2010 | Michiyochi |
| 2011/0089874 | A1 | | 4/2011 | Shimizu |
| 2011/0130103 | A1 | | 6/2011 | Michiyoshi |
| 2011/0163816 | A1 | | 7/2011 | Michiyoshi |

FOREIGN PATENT DOCUMENTS

| | | |
|---|---|---|
| JP | 2007-104769 | 4/2007 |
| JP | 2008-244841 | 10/2008 |
| JP | 2011-087440 | 4/2011 |

* cited by examiner

*Primary Examiner* — Joseph Chang
(74) *Attorney, Agent, or Firm* — Cooper & Dunham LLP

(57) ABSTRACT

A PWM signal generating circuit, printer, and PWM signal generating method are described. The PWM signal generating circuit includes: a single counter configured to count values expressed in N bits; and at least one arithmetic device configured to generate a PWM signal, each of the at least one arithmetic device including a pulse width data storage unit for storing N-bit pulse width data representing a pulse width of the PWM signal to be generated, and an adder for calculating a carry value from a most significant bit obtained when adding the count value and the pulse width data. A signal having a level corresponding to the carry value is output at every change in the count value so that the PWM signal having the pulse width of the pulse width data is generated.

10 Claims, 6 Drawing Sheets

PWM SIGNAL GENERATING CIRCUIT, PRINTER, AND PWM SIGNAL GENERATING METHOD

CROSS-REFERENCE TO RELATED APPLICATIONS

This patent application is based on and claims priority pursuant to 35 U.S.C. §119 to Japanese Patent Application No. 2013-000293, filed on Jan. 7, 2013, in the Japan Patent Office, the entire disclosure of which is hereby incorporated by reference herein.

BACKGROUND

1. Technical Field

The present invention relates to a PWM signal generating circuit that generates a rectangular wave signal (PWM signal) through pulse width modulation, and more particularly, to a PWM signal generating circuit that generates a plurality of PWM signals having different duty ratios, a printer including the PWM signal generating circuit, and a PWM signal generating method by the PWM signal generating circuit.

2. Description of the Related Art

Recently, there is a digital system to be used with generation of a PWM signal in order to carry out sequence control or to control rotation of a motor.

Patent Document 1 (Japanese Patent Application Publication No. 2008-244841-A1) describes a PWM signal generating circuit for generating a PWM signal which includes a counter for updating a count value based on an oscillation signal having a predetermined frequency, and an output circuit for changing the PWM signal into one of logic levels when the count value of the counter reaches a count value corresponding to a first predetermined value and changing the PWM signal into the other logic level when the count value of the counter reaches a count value corresponding to a second predetermined value. In particular, the output circuit includes a register to which a first predetermined value (a count value indicative of a rising position of the PWM signal) is set, a first comparator for comparing the first predetermined value with the count value, a register to which a second predetermined value (a count value indicative of a falling position of the PWM signal) is set, a second comparator for comparing the second predetermined value with the count value, and a T flip-flop for outputting the PWM signal. When an output signal of the first comparator makes a transition from L to H, an output signal of the T flip-flop subsequently makes a transition from L to H. When an output signal of the second comparator makes a transition from L to H, the output signal of the T flip-flop subsequently makes a transition from H to L. Consequently, a PWM signal having a duty ratio corresponding to a set value of the register is output. The invention disclosed in the Patent Document 1 may further include output circuits in order to generate the plurality of PWM signals. The count value of the counter is shared by the output circuits and a cycle of each of the PWM signals is equal to a cycle in which the count value of the counter is reset.

Patent Document 2 (Japanese Patent Application Publication No. 2007-104769-A1) describes a PWM signal generating device including an up-down counter to be operated based on a clock, a rewritable compare register for holding a compare value, a comparator for comparing the compare value of the compare register with a count value of the up-down counter to output a first coincidence signal in a count-up operation and a second coincidence signal in a count-down operation, an overhead bit register which is provided to change a pulse width of a PWM signal and serves to hold an overhead bit, and a PWM signal generator having a delay circuit for delaying either the first coincidence signal or the second coincidence signal depending on an overhead bit and serving to set a pulse width of a PWM signal based on one of the coincidence signals which is delayed by the delay circuit and the other coincidence signal which is not delayed. The delay circuit delays either the first coincidence signal or the second coincidence signal without using a clock having a higher frequency than a clock of the up-down counter and the PWM signal generator changes the pulse width of the PWM signal depending on the overhead bit. The invention disclosed in the Patent Document 2 generates a PWM signal by causing an output signal to make a transition from L to H when the count value is coincident with the compare value in the count-up operation of the up-down counter and causing the output signal to make a transition from H to L when the count value is coincident with the compare value in the count-down operation. However, a change in the pulse width of the PWM signal is always a double of a change in the compare value of the compare register. For this reason, a fall (or a rise) of the output signal is delayed depending on the overhead bit. Consequently, it is possible to finely set the pulse width of the PWM signal.

Patent Document 3 (Japanese Patent Application Publication No. 2011-087440-A1) describes a motor driving control device for causing cyclic current to flow to a coil having a plurality of phases of a motor including the coil, thereby driving a rotor of the motor rotatively, and the motor driving control device includes a position detector for outputting a position signal indicative of a rotating position of the rotor, a position change detector for outputting a position change signal indicative of a change in the rotating position of the rotor, a phase synchronization circuit for outputting absolute phase information in response to the position signal in phase synchronization with the position signal based on the position signal and the position change signal, and a driving controller for outputting a driving voltage signal to cause cyclic current to flow to the coil having the plurality of phases based on the absolute phase information. The invention disclosed in the Patent Document 3 includes a speed detector for detecting a frequency corresponding to a rotating speed of the rotor, and further includes a driving controller having a frequency error detector for detecting a frequency error between a target frequency corresponding to a target speed of the rotor and a frequency detected by the speed detector, a control voltage signal generator for generating a control voltage signal to drive the motor based on the frequency error, a sine wave generator for outputting a sine wave driving signal to cause sine wave-shaped current to flow to the coil having the plurality of phases based on the absolute phase information, and a sine wave amplitude modulator for modulating an amplitude of the sine wave driving signal in response to the control voltage signal, thereby generating a driving voltage signal.

SUMMARY

According to one aspect of the present invention, a PWM signal generating circuit has a single counter and at least one arithmetic device and generates a PWM signal from each of the at least one arithmetic device. The counter generates count values expressed in N bits, each of the at least one arithmetic device includes: a pulse width data storage unit for storing N-bit pulse width data representing a pulse width of the PWM signal to be generated; and an adder for calculating a carry value from a most significant bit obtained when adding the count value and the pulse width data, and a signal having a level corresponding to the carry value is output at every change in the count value so that the PWM signal having the pulse width of the pulse width data is generated.

DETAILED DESCRIPTION OF THE INVENTION

In recent years, a single semiconductor chip is provided with more functions. Consequently, it may be desirable to generate a plurality of PWM signals having different duty ratios as timing signals (for example, activation signals) to be supplied to respective function cells. For example, in a chip in which a large number of power supply function cells such as a DC/DC converter, an LDO regulator and the like are integrated, it is preferable to supply, to each function cell, timing signals of several tens of types when the number of them is large. Moreover, it is also preferable to enable the duty ratios of the timing signals to be changed programmably.

For example, in the case in which the plurality of PWM signals are to be generated according to the invention of the Patent Document 1, it is necessary to provide an output circuit (that is, two registers, two comparators and a T flip-flop) for every PWM signals.

In the case in which the plurality of PWM signals are to be generated according to the invention of the Patent Document 2, it is necessary to provide the compare register, the comparator, the overhead bit register and the PWM signal generator for every PWM signal.

As another method of generating the plurality of PWM signals, furthermore, it is supposed to provide a separate timer for each PWM signal to be generated or to successively control a timer by a CPU.

According to the related art, thus, in the case in which the plurality of PWM signals are to be generated, a circuit scale of the PWM signal generating circuit is increased. Depending on a type of a semiconductor chip (a power supply chip or the like), however, it is hard to micronize and/or multilayer a wiring in many cases. For this reason, it is desired to provide a PWM signal generating circuit capable of generating the plurality of PWM signals without increasing the circuit scale.

In view of the above, one objective of the present invention is to provide a PWM signal generating circuit capable of easily generating a PWM signal having a desirable duty ratio and readily generating a plurality of PWM signals having different duty ratios without requiring a complicated circuit. One other object of the present invention is to provide a printer including the PWM signal generating circuit and a PWM signal generating method to be executed by the PWM signal generating circuit.

A PWM signal generating circuit according to an embodiment of the present invention will be described below with reference to the drawings.

Figure 1:
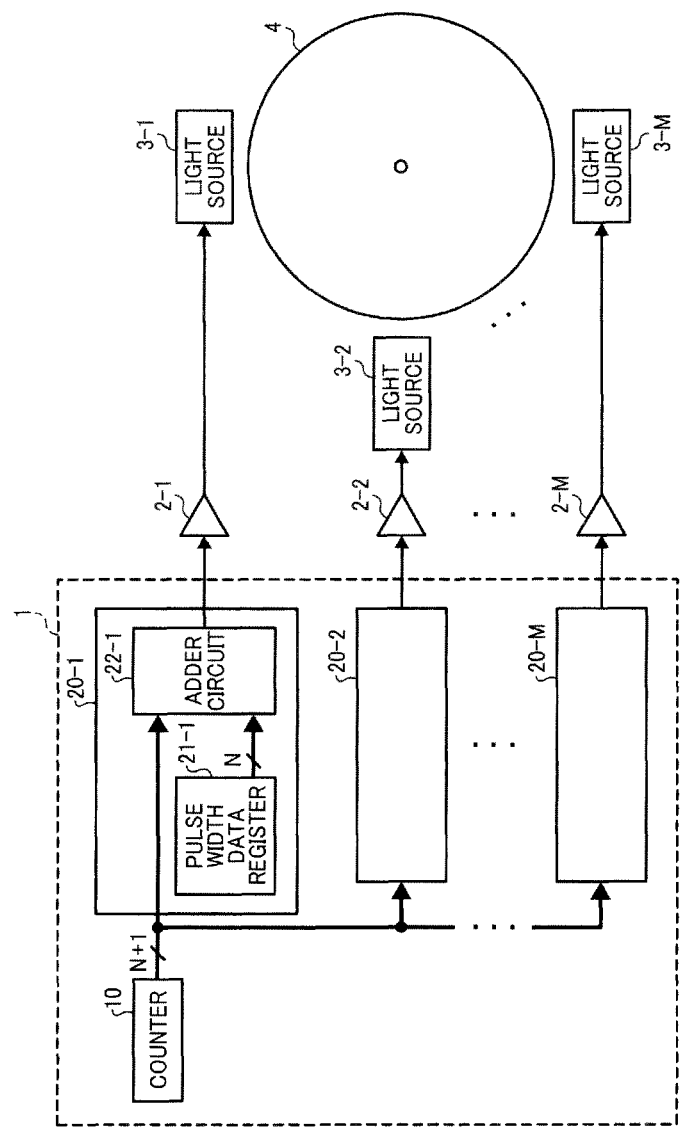
FIG. 1 is a block diagram showing a part of a structure of a printer including a PWM signal generating circuit 1 according to an embodiment of the present invention.

FIG. 1 is a block diagram showing a part of a structure of a printer including a PWM signal generating circuit 1 according to the embodiment of the present invention. The PWM signal generating circuit 1 includes one counter 10, at least one arithmetic circuits 20-1 to 20-M, and generates a PWM signal from each of the arithmetic circuits 20-1 to 20-M. In an embodiment which will be described, the PWM signal generating circuit 1 includes the arithmetic circuits 20-1 to 20-M, and the arithmetic circuits 20-1 to 20-M generate the plurality of PWM signals having different pulse widths.

The counter 10 generates a count value expressed in N bits, and furthermore, generates an enable bit indicating that count is performed and sends the generated count value and enable bit to each of the arithmetic circuits 20-1 to 20-M. The counter 10 may be an up counter, a down counter or an up-down counter. The arithmetic circuit 20-1 includes a pulse width data register 21-1 that stores pulse width data having N bits and representing a pulse width of a PWM signal to be generated, and an adder circuit 22-1 that calculates a carry value from a most significant bit obtained when adding the count value and the pulse width data. The adder circuit 22-1 outputs a signal having a level corresponding to the carry value at every change in the count value, thereby generating a PWM signal having a pulse width of the pulse width data. The other arithmetic circuits 20-2 to 20-M are also constituted in the same manner as the arithmetic circuit 20-1.

For example, the plurality of PWM signals are input to a plurality of driver circuits 2-1 to 2-M for driving a plurality of light sources 3-1 to 3-M which serve to carry out irradiation over a photoreceptor 4 of the printer in predetermined light quantities respectively, and control the light quantities of the plurality of light sources 3-1 to 3-M respectively.

Figure 2:
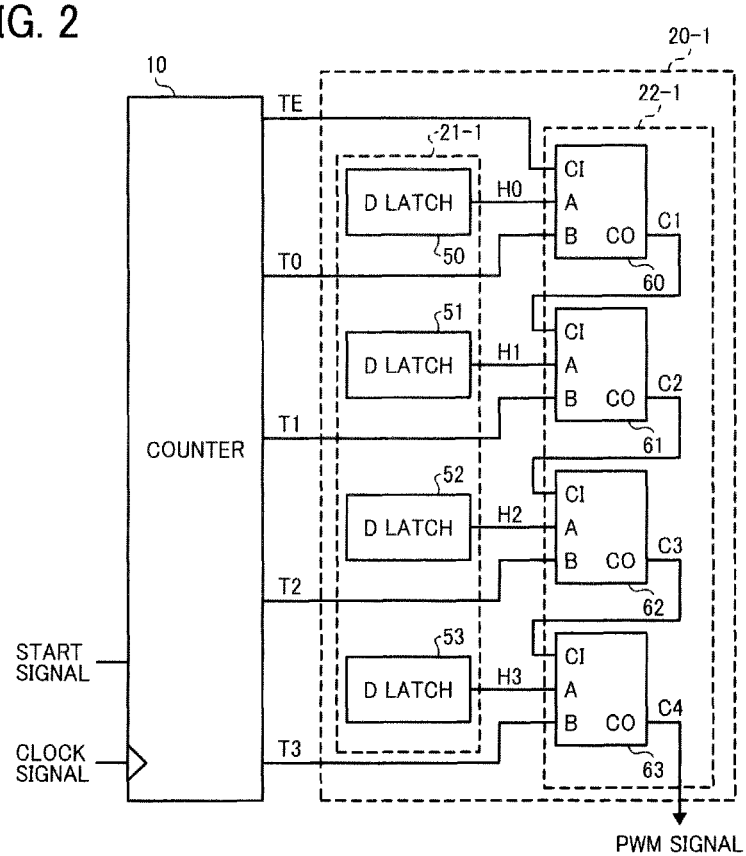
FIG. 2 is a block diagram showing a detailed structure of an arithmetic circuit 20-1 in FIG. 1.

FIG. 2 is a block diagram showing a detailed structure of the arithmetic circuit 20-1 in FIG. 1.

In this specification, there is described the case in which the pulse width is regulated in 16 stages, that is, the case in which the count value and the pulse width data are expressed in four bits. In recent years, the pulse width is regulated in more various stages in some cases. As is apparent from the following explanation, however, it is sufficient to simply increase the numbers of bits of the counter 10, the pulse width data register 21-1 and the adder circuit 22-1 regularly in order to expand the principle according to the embodiment that is described into 64 stages (6 bits) or 256 stages (8 bits).

With reference to FIG. 2, the counter 10 generates four bits T0 to T3 representing a count value, and an enable bit TE indicating that count is performed. The pulse width data register 21-1 includes D latches 50 to 53 for storing pulse width data of four bits H0 to H3. The adder circuit 22-1 includes adders 60 to 63 for adding the respective bits of the count values and the pulse width data. Each of the adders 60 to 63 is a full adder which does not output a sum but only carry values C1 to C4. Each of the adders 60 to 63 has a carry input terminal CI for a carry value from an adder of a lower bit in addition to input terminals A and B for the respective bits of the count value and the pulse width data. However, the enable bit TE is input to the carry input terminal CI of the adder 60 of a least significant bit.

Figure 3:
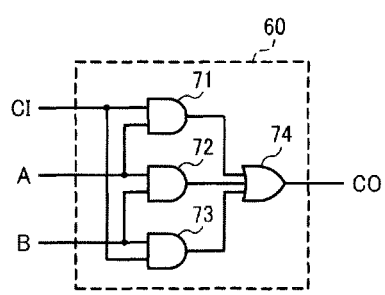
FIG. 3 is a circuit diagram showing an exemplary structure of an adder 60 in FIG. 2.

FIG. 3 is a circuit diagram showing an exemplary structure of the adder 60 in FIG. 2. Since the adder 60 does not require to calculate the sum of the count value and the pulse width data, it may be constituted as a majority logic circuit including AND circuits 71 to 73 and an OR circuit 74 as shown in FIG. 3, for example. The adder 60 may have a different structure from that in FIG. 3 if it can calculate the carry values for the count value and the pulse width data. The other adders 61 to 63 are also constituted in the same manner as the adder 60.

In the adder circuit 22-1 in FIG. 2, the carry value C4 from the adder 63 of the most significant bit is equivalent to a PWM signal having a pulse width of the pulse width data.

The other arithmetic circuits 20-2 to 20-M are also constituted in the same manner as the arithmetic circuit 20-1 in FIG. 2.

Figure 4:
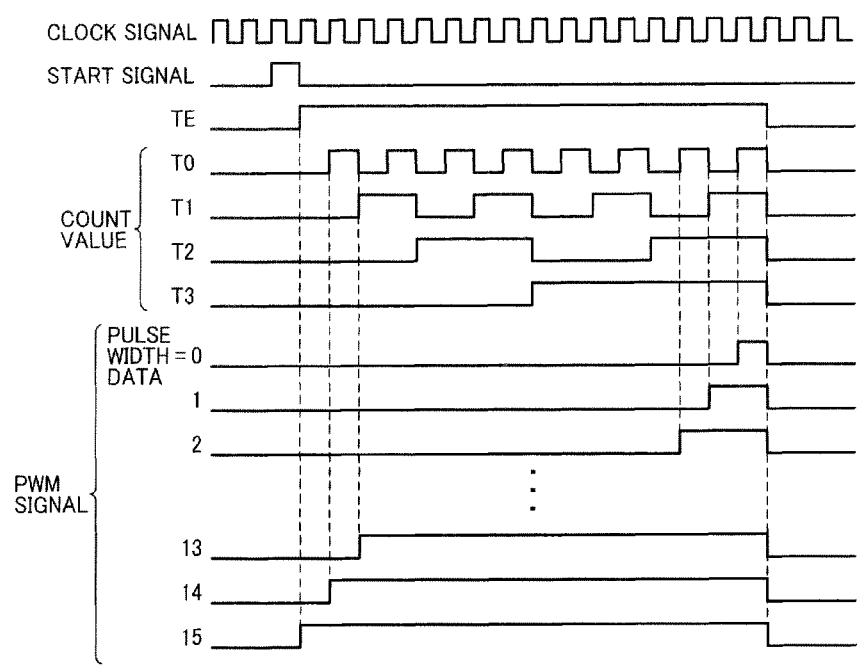
FIG. 4 is a timing chart showing an operation of the arithmetic circuit 20-1 in FIG. 2.

FIG. 4 is a timing chart showing an operation of the arithmetic circuit 20-1 in FIG. 2. FIG. 4 shows the case in which the counter 10 is an up counter. When a start signal is input to the counter 10, the counter 10 causes the enable bit to make a transition of from L to H, thereby starting count. The adder circuit 22-1 generates a PWM signal having a pulse width of the pulse width data based on the count value and the pulse width data.

Referring to FIG. 4, by using the enable bit TE, it is possible to generate a PWM signal having a pulse width in 16 stages from a minimum pulse width which is equal to one count (when the pulse width data is equal to "0") to a maximum pulse width which is equal to 16 counts (when the pulse width data is equal to "15"). In the case in which the enable bit TE is not used (that is, TE=0), the PWM signal still has the L level when the pulse width data is equal to "0", and it is possible to generate a PWM signal having a pulse width in 15 stages from the minimum pulse width which is equal to one count (when the pulse width data is equal to "1") to a maximum pulse width which is equal to 15 counts (when the pulse width data is equal to "15"). In the case in which the enable bit TE is not used, however, it is possible to simplify the structure of the PWM signal generating circuit 1.

According to the PWM signal generating circuit 1 in FIG. 1, it is possible to easily generate a PWM signal having a desirable pulse width (duty ratio) without requiring a complicated circuit.

According to the PWM signal generating circuit 1 in FIG. 1, moreover, it is also possible to easily generate a plurality of PWM signals having different duty ratios without requiring a complicated circuit. In this case, the pulse width data registers of the arithmetic circuits 20-1 to 20-M store the pulse width data representing different pulse widths respectively, and the arithmetic circuits 20-1 to 20-M generate the plurality of PWM signals having different pulse widths respectively.

The plurality of PWM signals may be input to the driver circuits 2-1 to 2-M for driving the light sources 3-1 to 3-M of the printer respectively and may be used for controlling the light quantities of the light sources 3-1 to 3-M respectively as described above, for example. With a simpler structure than that in the related art, consequently, it is possible to control the light quantities of the light sources 3-1 to 3-M by using PWM control. The plurality of PWM signals may be used for controlling an optional device capable of applying the PWM control in addition to the light sources 3-1 to 3-M of the printer.

According to the PWM signal generating circuit 1 in FIG. 1, a PWM signal is not generated by using a comparator and a flip-flop as in the related art but a PWM signal having a desirable duty ratio can be generated by using only the adder. In execution, moreover, it is not necessary to use a latch for holding the states of the H level and the L level of the PWM signal to be output or a delay circuit to finely set the pulse width of the PWM signal. Therefore, it is possible to reduce an area or power consumption.

Figure 5:
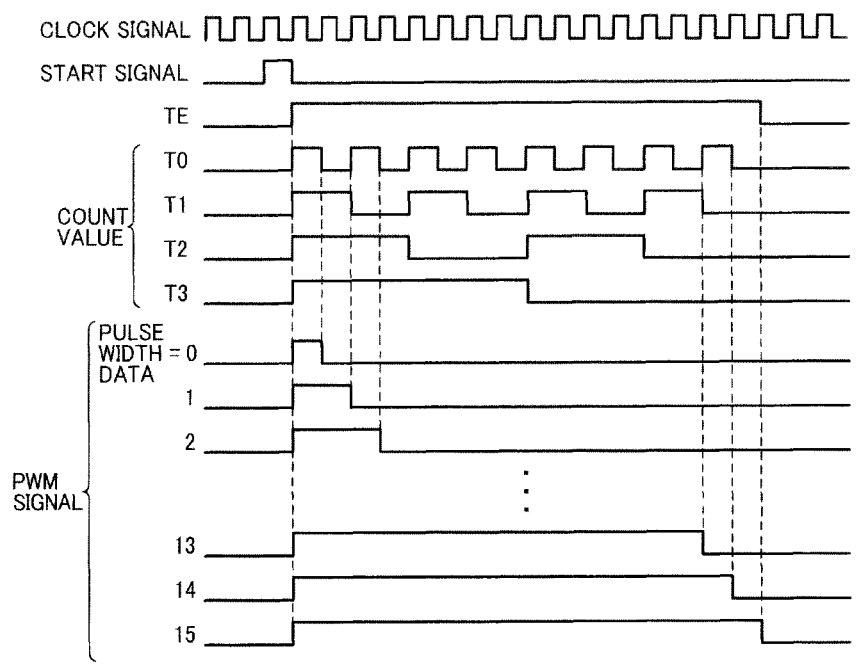
FIG. 5 is a timing chart showing an operation of an arithmetic circuit in a PWM signal generating circuit according to a first variant of the embodiment according to the present invention.

FIG. 5 is a timing chart showing an operation of an arithmetic circuit in a PWM signal generating circuit according to a first variant of the embodiment according to the present invention. FIG. 5 shows the case in which the counter 10 is a down counter. The other components of the PWM signal generating circuit are the same as those shown in FIGS. 1 to 3. An arithmetic circuit related to the timing chart of FIG. 5 is operated in the same manner as in the case of FIG. 4.

Figure 6:
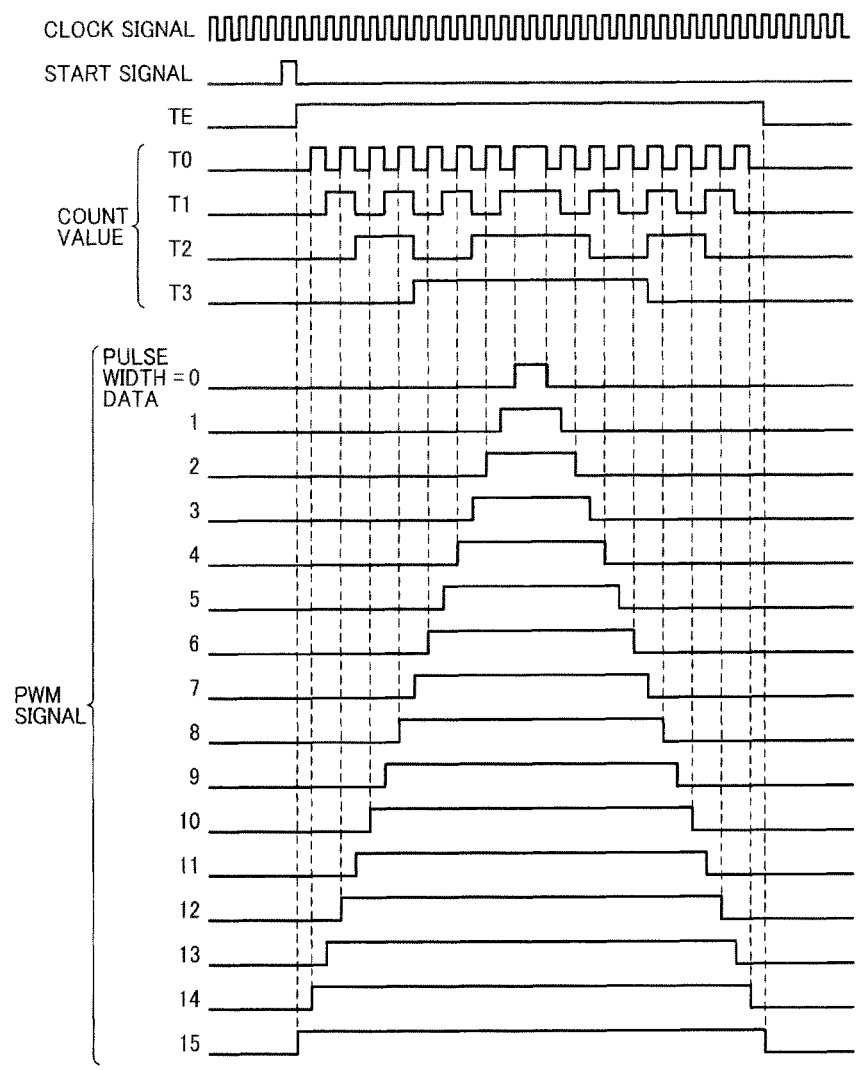
FIG. 6 is a timing chart showing an operation of an arithmetic circuit in a PWM signal generating circuit according to a second variant of the embodiment according to the present invention.

FIG. 6 is a timing chart showing an operation of an arithmetic circuit in a PWM signal generating circuit according to a second variant of the embodiment according to the present invention. FIG. 6 shows the case in which the counter is an up-down counter. The other components of the PWM signal generating circuit are the same as those shown in FIGS. 1 to 3. By thus increasing/decreasing a count value of the counter, it is possible to cause a step width of a pulse width to be equal to that in the case in which an up counter or a down counter is used, and furthermore, to cause a central position between a rise and a fall in a PWM signal to be identical over all of the pulse widths.

Figure 7:
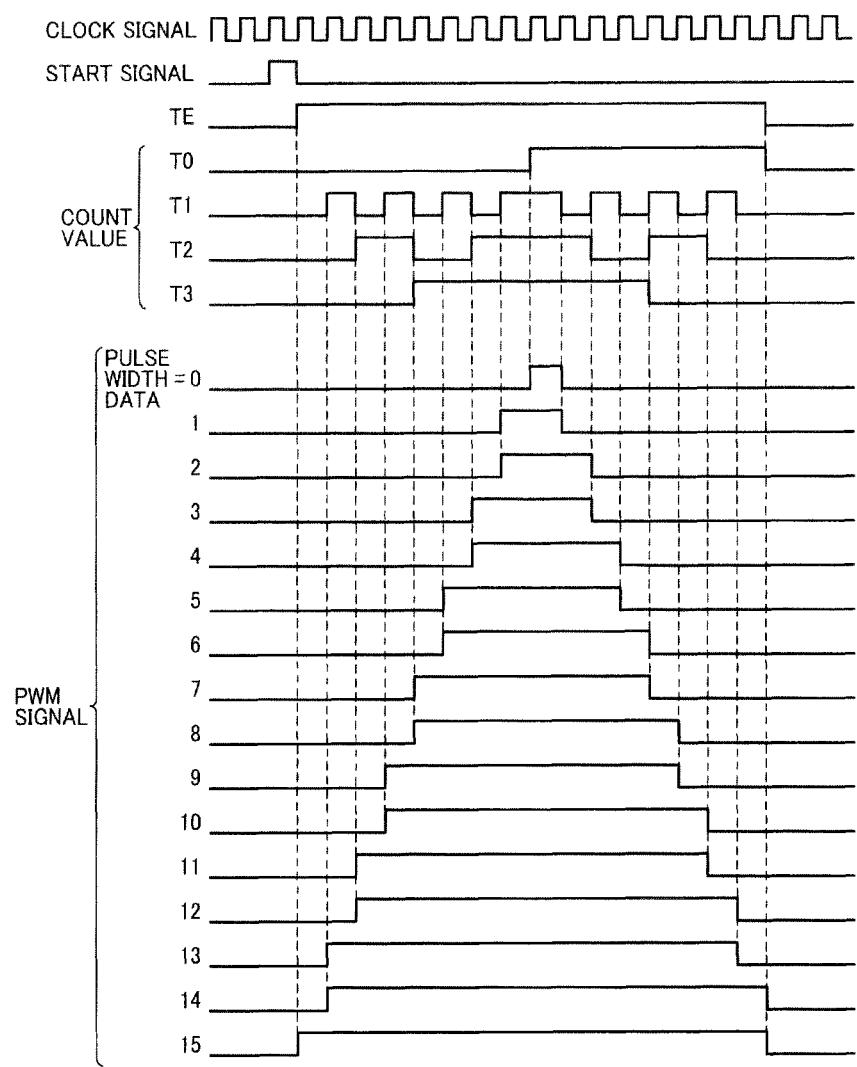
FIG. 7 is a timing chart showing an operation of an arithmetic circuit in a PWM signal generating circuit according to a third variant of the embodiment according to the present invention.

FIG. 7 is a timing chart showing an operation of an arithmetic circuit in a PWM signal generating circuit according to a third variant of the embodiment according to the present invention. FIG. 7 also shows the case in which the counter is an up-down counter. The other components of the PWM signal generating circuit are the same as those shown in FIGS. 1 to 3.

In the case in which the arithmetic circuit is operated in accordance with the timing chart of FIG. 6, it is necessary to double an operating clock frequency of the counter or to halve resolution of the pulse width as compared with the case in FIG. 4 or FIG. 5. In the former case, power consumption is increased. In the latter case, precision in the pulse width is reduced.

In order to avoid the foregoing, the counter counts only one of an even number value and an odd number value in count values expressed in N bits in an up-count operation and counts only the other in a down-count operation. In the case shown in FIG. 7, only even number values in count values of 1 to 16 expressed in four bits are counted in the up-count operation (0→2→4→6→8→10→12→14), and only odd number values are counted in the down-count operation (15→13→11→9→7→5→3→1). A count value is "0" in a subsequent cycle to the count value of "1" so that the count operation is ended.

By carrying out the count operation shown in FIG. 7, it is possible to generate a PWM signal without reducing precision in a pulse width with the same operating clock frequency as that in the case in which the counter is constituted by using the up counter or the down counter. Moreover, the central position between the rise and the fall in the PWM signal can be almost identical over all of the pulse widths.

The embodiment according to the present invention is not restricted to the PWM signal generating circuit in FIG. 1 or the like but the PWM signal generating method including the steps described in relation to the PWM signal generating circuit in FIG. 1 or the like is executed so that a PWM signal having a desirable duty ratio can be generated. In addition, it is also possible to constitute a machine readable program including the steps described in relation to the PWM signal generating circuit in FIG. 1 or the like.

The PWM signal generating circuit, the printer and the PWM signal generating method according to the embodiment of the present invention include the following structures.

According to a first aspect of the present invention, a PWM signal generating circuit has a single counter and at least one arithmetic device and generates a PWM signal from each of the at least one arithmetic device. The counter generates count values expressed in N bits, each of the at least one arithmetic device includes: a pulse width data storage unit for storing N-bit pulse width data representing a pulse width of the PWM signal to be generated; and an adder for calculating a carry value from a most significant bit obtained when adding the count value and the pulse width data, and a signal having a level corresponding to the carry value is output at every change in the count value so that the PWM signal having the pulse width of the pulse width data is generated.

According to a second aspect of the present invention, in the PWM signal generating circuit according to the first aspect, the adder does not calculate a sum of the count value and the pulse width data.

According to a third aspect of the present invention, in the PWM signal generating circuit according to the first or second aspect, the counter generates an enable bit indicating that count is performed, and the adder uses the enable bit as a carry value to a least significant bit.

According to a fourth aspect of the present invention, in the PWM signal generating circuit according to the first to third aspects, the counter is an up counter.

According to a fifth aspect of the present invention, in the PWM signal generating circuit according to the first to third aspects, the counter is a down counter.

According to a sixth aspect of the present invention, in the PWM signal generating circuit according to the first to third aspects, the counter is an up-down counter.

According to a seventh aspect of the present invention, in the PWM signal generating circuit according to the sixth aspect, the counter counts only one of an even number value and an odd number value in the count values expressed in the N bits in an up-count operation and counts only the other in a down-count operation.

According to an eighth aspect of the present invention, the PWM signal generating circuit according to the seventh aspect further includes a plurality of arithmetic devices, the pulse width data storage units of the arithmetic devices storing pulse width data representing different pulse widths respectively, and the arithmetic devices generating the plurality of PWM signals having the different pulse widths.

According to a ninth aspect of the present invention, a printer includes: a photoreceptor; the PWM signal generating circuit according to the eighth aspect; a plurality of light sources for carrying out irradiation over the photoreceptor in a predetermined light quantity; and a plurality of driver circuits for driving the light sources, wherein the plurality of PWM signals are input to the plurality of driver circuits respectively and control the light quantities of the plurality of light sources respectively.

According to a tenth aspect of the present invention, a PWM signal generating method by using a single counter and at least one arithmetic device, of generating a PWM signal from each of the at least one arithmetic device, includes the steps: storing, in each of the at least one arithmetic device, N-bit pulse width data representing a pulse width of the PWM signal to be generated; generating a count value expressed in N bits by using the counter; and calculating a carry value from a most significant bit obtained when adding the count value and the pulse width data by using each of the at least one arithmetic device, a signal having a level corresponding to the carry value being output at every change in the count value so that the PWM signal having the pulse width of the pulse width data is generated.

According to the PWM signal generating circuit, the printer and the PWM signal generating method in accordance with the embodiment of the present invention, it is possible to easily generate a PWM signal having a desirable duty and to readily generate a plurality of PWM signals having different duty ratios without requiring a complicated circuit.

According to the PWM signal generating circuit, the printer and the PWM signal generating method in accordance with the embodiment of the present invention, in the case in which a PWM signal is generated by using the up counter or the down counter, the adder circuit is used so that the comparator and the T flip-flop in the related art are not required. Consequently, it is possible to generate a PWM signal on a smaller circuit scale.

According to the PWM signal generating circuit, the printer and the PWM signal generating method in accordance with the embodiment of the present invention, moreover, also in the case in which a PWM signal is generated by using the up-down counter, the adder circuit is used so that the comparator, the flip-flop, the delay circuit and the like in the related art are not required. By counting only even number values in the up-count operation and counting only odd number values in the down-count operation, furthermore, it is possible to generate a PWM signal without reducing precision in a pulse width with the same operating clock frequency as that in the case in which the counter is constituted by using the up counter or the down counter.

What is claimed is:

1. A PWM signal generating circuit, comprising:
a single counter configured to count values expressed in N bits; and
at least one arithmetic device configured to generate a PWM signal, each of the at least one arithmetic device including:
a pulse width data storage unit for storing N-bit pulse width data representing a pulse width of the PWM signal to be generated; and
an adder for calculating a carry value from a most significant bit obtained when adding the count value and the pulse width data,
wherein a signal having a level corresponding to the carry value is output at every change in the count value so that the PWM signal having the pulse width of the pulse width data is generated.

2. The PWM signal generating circuit according to claim 1, wherein the adder does not calculate a sum of the count value and the pulse width data.

3. The PWM signal generating circuit according to claim 1, wherein the counter generates an enable bit indicating that count is performed, and
the adder uses the enable bit as a carry value to a least significant bit.

4. The PWM signal generating circuit according to claim 1, wherein the counter is an up counter.

5. The PWM signal generating circuit according to claim 1, wherein the counter is a down counter.

6. The PWM signal generating circuit according to claim 1, wherein the counter is an up-down counter.

7. The PWM signal generating circuit according to claim 6, wherein the counter counts only one of an even number value and an odd number value in the count values expressed in the N bits in an up-count operation and counts only the other in a down-count operation.

8. The PWM signal generating circuit according to claim 1, wherein, when the at least one of arithmetic device includes a plurality of arithmetic devices, the pulse width data storage units of the plurality of arithmetic devices respectively store pulse width data representing different pulse widths, and the arithmetic devices respectively generate the plurality of PWM signals having the different pulse widths.

9. A printer comprising:

a photoreceptor;

the PWM signal generating circuit according to claim 8;

a plurality of light sources configured to irradiate the photoreceptor in a predetermined light quantity; and a plurality of driver circuits configured to drive the light sources, wherein the plurality of PWM signals are input to the driver circuits respectively and control the light quantities of the light sources respectively.

10. A PWM signal generating method, performed by a PWM signal generating circuit including a single counter and at least one arithmetic device, the method comprising:

storing, in each of the at least one arithmetic device, N-bit pulse width data representing a pulse width of the PWM signal to be generated;

generating a count value expressed in N bits by using the counter; and calculating a carry value from a most significant bit obtained when adding the count value and the pulse width data by using each of the at least one arithmetic device, wherein a signal having a level corresponding to the carry value is output at every change in the count value so that the PWM signal having the pulse width of the pulse width data is generated.

* * * * *